United States Patent
Miller et al.

(10) Patent No.: US 7,525,302 B2
(45) Date of Patent: Apr. 28, 2009

(54) METHOD OF ESTIMATING CHANNEL BANDWIDTH FROM A TIME DOMAIN REFLECTOMETER (TDR) MEASUREMENT USING RISE TIME AND MAXIMUM SLOPE

(75) Inventors: Charles A. Miller, Fremont, CA (US); Jim Chih-Chiang Tseng, Dublin, CA (US)

(73) Assignee: FormFactor, Inc., Livermore, CA (US)

( * ) Notice: Subject to any disclaimer, the term of this patent is extended or adjusted under 35 U.S.C. 154(b) by 328 days.

(21) Appl. No.: 11/048,383

(22) Filed: Jan. 31, 2005

(65) Prior Publication Data

US 2006/0170431 A1 Aug. 3, 2006

(51) Int. Cl.
*G01R 27/04* (2006.01)
(52) U.S. Cl. .................................. 324/158.1
(58) Field of Classification Search ........................ None
See application file for complete search history.

(56) References Cited

U.S. PATENT DOCUMENTS

| | | | | |
|---|---|---|---|---|
| 3,651,432 A | * | 3/1972 | Henschen et al. | 333/33 |
| 4,700,362 A | * | 10/1987 | Todd et al. | 375/249 |
| 4,755,742 A | * | 7/1988 | Agoston et al. | 324/642 |
| 5,256,996 A | * | 10/1993 | Marsland et al. | 333/20 |
| 5,561,377 A | * | 10/1996 | Strid et al. | 324/754 |
| 5,684,374 A | * | 11/1997 | Chaffee | 318/616 |
| 5,781,021 A | * | 7/1998 | Ilani | 324/754 |
| 5,847,569 A | * | 12/1998 | Ho et al. | 324/752 |
| 5,886,808 A | * | 3/1999 | Skeldon et al. | 359/264 |
| 5,978,742 A | * | 11/1999 | Pickerd | 702/66 |
| 6,429,674 B1 | * | 8/2002 | Barth et al. | 324/763 |
| 6,449,741 B1 | * | 9/2002 | Organ et al. | 714/724 |
| 6,646,602 B2 | * | 11/2003 | Krikorian et al. | 342/430 |
| 6,675,339 B1 | * | 1/2004 | Lanier et al. | 714/744 |
| 6,727,840 B1 | * | 4/2004 | Sullivan | 342/13 |
| 6,798,211 B1 | * | 9/2004 | Rockwell et al. | 324/527 |
| 6,911,814 B2 | * | 6/2005 | Miller et al. | 324/158.1 |
| 7,120,563 B2 | * | 10/2006 | Bechhoefer et al. | 702/189 |
| 2004/0230385 A1 | | 11/2004 | Bechhoefer et al. | |

OTHER PUBLICATIONS

"On the effective measurement frequency of time domain reflectometry in dispersive and nonconductive dielectric materials", by Robinson et al. Water Resources Research, vol. 41 WO2007, published Feb. 2005, pp. 1-9).*

(Continued)

*Primary Examiner*—Paresh Patel
(74) *Attorney, Agent, or Firm*—N. Kenneth Burraston

(57) ABSTRACT

Bandwidth of a test channel is determined from a single port Time Domain Reflectometer (TDR) measurement with the channel terminated in a short or an open circuit. Bandwidth is estimated by: (1) making a TDR measurement of a channel terminated in a short or open circuit; (2) determining a maximum slope of the reflection from the TDR measurement; (3) calculating an interpolated rise or fall time, for example by taking 80% of the applied voltage between the 10% and 90% points, and then dividing the applied voltage by the maximum slope determined; (4) dividing the overall interpolated rise time by the square root of two to account for the TDR signal proceeding through the channel twice; (5) removing the contribution of rise time from measurement equipment; and (6) completing calculation of channel bandwidth using a formula to relate bandwidth to rise time, such as: bandwidth=0.35/rise time.

17 Claims, 3 Drawing Sheets

OTHER PUBLICATIONS

"Relating wideband DSO risetime to bandwidth: Lose the .35!" by Dennis Weller, Dec. 2002, 4 pages).*

"Effect of measurement bandwidth on time domain device modeling, Virginia Polytechnic Institute and State University", by Fidanboylu et al. Blacksburg, VA, 1990, 2-pages.*

Application Note 62, Time Domain Reflectometry, Hewlett-Packard Company, Palo Alto, California, 1964, pp. 4-3, 4-4.

Howard W. Johnson and Martin Graham, "High-Speed Digital Design", Prentice Hall PTR, Englewood Cliffs, New Jersey, 1993, p. 406.

Howard W. Johnson, and Martin Graham, "High-Speed Digital Design", Prentice Hall PTR, Englewood Cliffs, New Jersey, 1993, p. 400.

Howard W. Johnson and Martin Graham, "High-Speed Digital Design", Prentice Hall PRT, Englewood Cliffs, New Jersey, 1993, p. 399.

William McC. Siebert, Circuits, Signals, and Systems, The MIT Press, Cambridge, Massachusetts, 1986, pp. 488-489.

Robinson, D.A., M.G. Schaap, D. Or, and S.B. Jones (2005), "On the effective measurement frequency of time domain reflectometry in dispersive and nonconductive dielectric materials", 'Water Resour. Res.,' 41, W02007, dio:10.1029/2004WR003816.

PCT Search Report PCT/US 06/03385, (Jul. 14, 2008).

* cited by examiner

METHOD OF ESTIMATING CHANNEL BANDWIDTH FROM A TIME DOMAIN REFLECTOMETER (TDR) MEASUREMENT USING RISE TIME AND MAXIMUM SLOPE

BACKGROUND

1. Technical Field

The present invention relates in general to a method of measuring the bandwidth of a signal channel that carries an electrical signal. More particularly, the present invention relates to a single port measurement method to determine the bandwidth of a test signal channel of a wafer test system, the channel being provided through a probe card, where the probe card is used to test integrated circuits (ICs) on a wafer.

2. Related Art

A wafer test system includes a number of test channels for carrying test signals to and from ICs on a wafer. Bandwidth testing of the probe card or test interface is performed to assure the integrity and frequency response of the test interface. Many test systems employ Time Domain Reflectometry (TDR) to measure and calibrate the path delay of the interface to the Device Under Test (DUT) when the interface is open circuit or otherwise not in contact with the DUT. As presently deployed however, the TDR measurement does not directly give an indication of the channel Bandwidth. Direct use of the reflected signal rise time is not practical because impedance mismatches and discontinuities in the interface create reflections and amplitude variations that adversely affect the true bandwidth measurement.

FIG. 1 shows a block diagram of a test system using a probe card for testing ICs on a semiconductor wafer. The test system includes a test controller 4 connected by a communication cable 6 to a test head 8. The test system further includes a prober 10 made up of a stage 12 for mounting a wafer 14 being tested, the stage 12 being movable to contact the wafer 14 with probes 16 on a probe card 18. The prober 10 includes the probe card 18 supporting probes 16 which contact ICs formed on the wafer 14.

In the test system, test data is generated by the test controller 4 and transmitted on individual test channels through the communication cable 6, test head 8, connectors 24, probe card 18, probes 16 and ultimately to ICs on the wafer 14. The probe card 18 serves to link each channel to a separate one of the probes 16. Test results are then provided from ICs on the wafer back through the probe card 18 to the test head 8 for transmission back to the test controller 4. Once testing is complete, the wafer is diced up to separate the ICs.

FIG. 2 is a cross sectional view showing details of typical components of the probe card 18. The probe card 18 is configured to provide both electrical pathways and mechanical support for test channels connecting through probes 16 to contact ICs on a wafer. The probe card electrical pathways are provided through a printed circuit board (PCB) 30, an interposer 32, and a space transformer 34. Channels from the test head 8 are directed to individual pins of multi-pin connectors 24 typically connected around the periphery of the PCB 30. Traces 40 then continue the channels paths from connectors 24 through the PCB 30 to contact pads on the opposing side of the PCB 30 spaced to match the routing pitch of pads on the space transformer 34. The interposer 32 includes a substrate 42 with spring probe electrical contacts 44 disposed on both sides. The interposer 32 continues to provide the channel paths from the pads on the PCB 30 to contact pads on a space transformer 34. Traces 46 in the space transformer 34 distribute or "space transform" the channel lines from the interposer to spring probes 16 configured in an array. The space transformer 34 with embedded traces and connected probes is referred to as a probe head.

Mechanical support for the electrical components is provided by a back plate 50, bracket 52, frame 54, leaf springs 56, and leveling pins 62. The back plate 50 is connected by screws 59 to the bracket 52 and PCB 30. The leaf springs 56 are attached by screws 58 to the bracket 52. The leaf springs 56 extend to movably hold the frame 54 within the interior walls of the bracket 52. The frame 54 then supports the space transformer 34. Leveling pins 62 complete the mechanical support, and are adjusted so that brass spheres 66 provide a point contact with the space transformer 34. Leveling pins 62 are adjustable to level the space transformer 34 and assure all the probes 16 will make contact with a wafer.

Although FIG. 1 provides an exemplary wafer test system configuration, it is contemplated that other test systems may be served by the present invention. For instance, the probe interface might be replaced with one or more sockets for testing of packaged or bare devices. Such test board systems for testing singulated devices are often referred to as "load boards". Similarly, although FIG. 2 illustrates one configuration for connecting test channels of a wafer test system to contacts that can connect to ICs on a wafer, other configurations for channels can be provided. For example, although probes 16 are shown as wire type spring probes, other electrical contacts such as pogo pins, cobra probes, lithographically formed spring probes, or conductive bumps might be used. Similarly, the interposer 32 can be replaced with wire bonds or a removable connector. For convenience, components of the overall test system of FIG. 1 and probe card of FIG. 2 will be referenced subsequently.

After manufacture of a probe card, testing is performed to determine the electrical and mechanical properties of the probe card. Signal integrity testing provides a determination of operation bandwidth specifications of the probe card channels, as well as the detection of both hard (manufacturing) and soft (design) errors in the test interface.

FIG. 3 illustrates a typical test configuration of test system components to determine the bandwidth of individual channels. As shown, the test components include a test system analyzer 70, which may be the tester system 4 of FIG. 1 itself, or a separate testing device such as a vector network analyzer (VNA) used to determine the S parameters of a system. A first port 72 of the test system analyzer 70 is connected to at least one test channel in the cable 6 that is provided through test head 8 (as illustrated by line 73). The test channel then proceeds through probe card 18 and one of its probes 16 to one of a number of pads 74 on a PCB 76. The PCB 76 is specifically created for calibration of the probe card 18 and includes pads 74 for connection of channels back through the test system analyzer through a cable 77. The cable 77 is connected back to a second port 78 of the test system analyzer 70. The through path between the first and second ports 72 and 78 of the test system analyzer enable a signal to be transmitted to determine parameters of the test system.

Measurement of a test signal using the test setup of FIG. 3 enables a simple determination of bandwidth. Bandwidth is specified as the frequency at which a sinusoidal input signal voltage is attenuated to 70.7% of its original amplitude, also known as the −3 dB or half power point. FIG. 4 shows a measured response for a 100 MHz test channel line.

Another way to indirectly measure bandwidth of a channel is to measure the rise time of a signal through the channel and correlate the rise time to bandwidth. One measure of the rise time of an input signal is the time for a signal to transition from 10% to 90% of the maximum signal amplitude. With the 10% to 90% rise time, bandwidth can be calculated using the formula: bandwidth×rise time=0.35. Thus the bandwidth measured is defined as: bandwidth=0.35/(Tr10-90), where the measured rise time from 10% to 90% is labeled (Tr10-90). Determination of bandwidth using a 10% to 90% rise time measurement is illustrated in FIG. 5.

Bandwidth can be determined from a rise time over a smaller portion of a signal transition, such as a 20% to 80% range. For a 20% to 80% rise time, bandwidth is typically calculated using the formula: bandwidth×rise time=0.22. Thus, for measurements based on a 20% to 80% rise time, the bandwidth is defined as: bandwidth=0.22/(Tr20-80), where the measured rise time is labeled (Tr20-80).

It is also well known that the overall rise time of a system labeled (Toa) is the square root of the sum of the squares of the individual component rise times ($T_1, T_2, \ldots$) represented as follows:

$$Toa = \sqrt{T_1^2 + T_2^2 + T_3^2}$$

To isolate the bandwidth measurement of the probe card alone, test measurements can be made to determine the rise time through components without the probe card 18 between the test ports of the calibration device 70. The equation for Toa shown above can then be used to separate out the rise time measurement of the probe card from the overall rise time Toa.

Due to changes in the channel bandwidth after multiple contacts of the test probes to ICs on wafers, it may be desirable to verify that the bandwidth of each channel is meeting specification before the probe card is used to test DUT specifications. With the probe card installed in a test system for testing ICs on wafers, it is typically inconvenient to reconfigure the test system to provide a two port measurement setup as shown in FIG. 3 to enable bandwidth verification for all channels of the probe card or DUT interface. It would be desirable to provide a more convenient method for determining the bandwidth of the individual channels of the test system.

SUMMARY

In accordance with the present invention, a method is provided to derive bandwidth directly from a single port Time Domain Reflectometry (TDR) measurement.

Unlike a through port measurement system requiring two ports to determine bandwidth, as illustrated by the calibration setup of FIG. 3, using the method according to the present invention channel bandwidth can be estimated based on a single port measurement with a channel terminated in a short or an open circuit. A short circuit can be created by contacting the probe of a channel to a metal ground plane. An open circuit can be created by simply not contacting the spring probes.

Because a TDR measurement is distorted by multiple reflections caused by channel discontinuities and impedance variations, conventional methods to determine bandwidth based on a 10% to 90% rise time measurement, or a 20% to 80% rise time measurement do not yield accurate or repeatable results. In accordance with the present invention, however, bandwidth can be estimated using a single port measurement with the following steps:

1. Take a TDR measurement of a channel terminated in a short circuit or open circuit.
2. Determine the maximum slope of the reflection of the TDR measurement.
3. Interpolate the $1^{st}$ order overall rise or fall time (Toa) based on the maximum slope. For example divide 80% of the applied voltage of the TDR measurement when using Tr10-90 by the maximum slope determined in step 2.
4. Repeat steps 1 through 3 above without the probe card channel to interpolate the $1^{st}$ order rise or fall time of the measuring equipment (Ttest).
5. Remove the rise time contribution of the measuring equipment using the equation indicating that the overall rise time of a system (Toa) is the square root of the sum of the squares of the individual rise times including Ttest and the measure round trip rise time of the channel (Tround):

$$Toa = \sqrt{Ttest^2 + Tround^2}$$

6. Divide Tround by the square root of two to reveal a single pass channel rise time. This is done since the TDR reflection passes through the channel twice, once in the forward direction providing a rise time Tforward and another in the reverse direction providing a rise time Treverse revealing total round trip rise time Tround as follows:

$$Tround = \sqrt{Tforward^2 + Treverse^2}$$

By setting Tforward=Treverse=Tchannel and solving for Tchannel:

$$Tchannel = Tround/\sqrt{2}$$

This yields the approximate rise time through the channel once in either the forward direction or once in the reverse direction. The interpolation based on the maximum slope removes the deleterious affects on the rise or fall time caused by impedance discontinuities or transmission line mismatches and results in an $1^{st}$ order rise time number that is applicable to the bandwidth equation in the next section.

7. Calculate the channel bandwidth using a formula to relate bandwidth to rise time, such as: bandwidth=0.35/(Tr10-90), or bandwidth=0.22/(Tr20-80)

BRIEF DESCRIPTION OF THE DRAWINGS

Further details of the present invention are explained with the help of the attached drawings in which.

DETAILED DESCRIPTION

Figure 1:
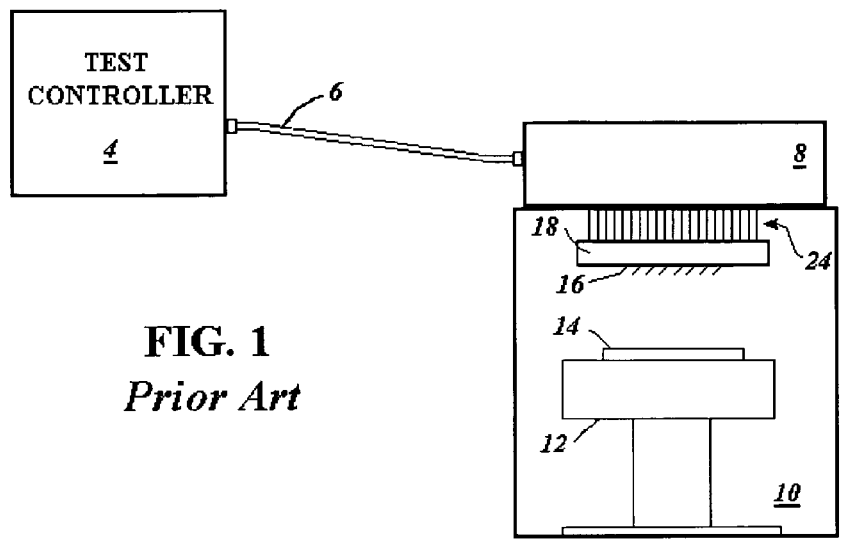
FIG. 1 shows a simplified block diagram of a conventional test system for testing ICs on a semiconductor wafer.
Figure 2:
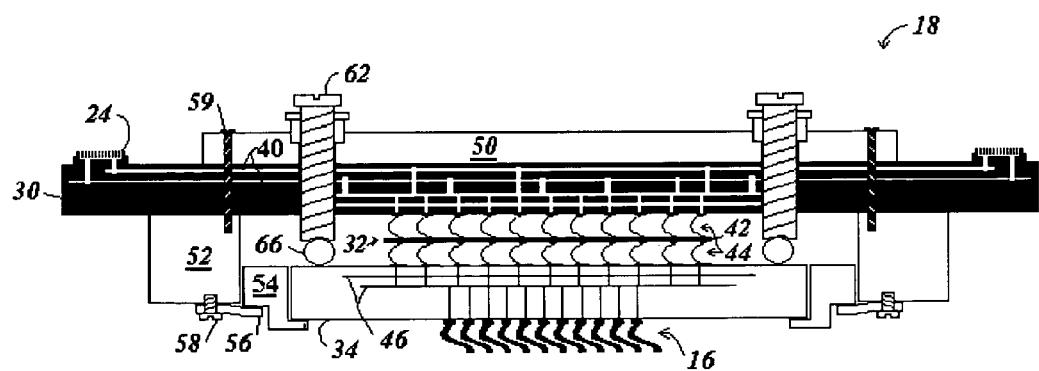
FIG. 2 is a cross sectional view showing details of typical components of the probe card of the test system of FIG. 1.
Figure 3:
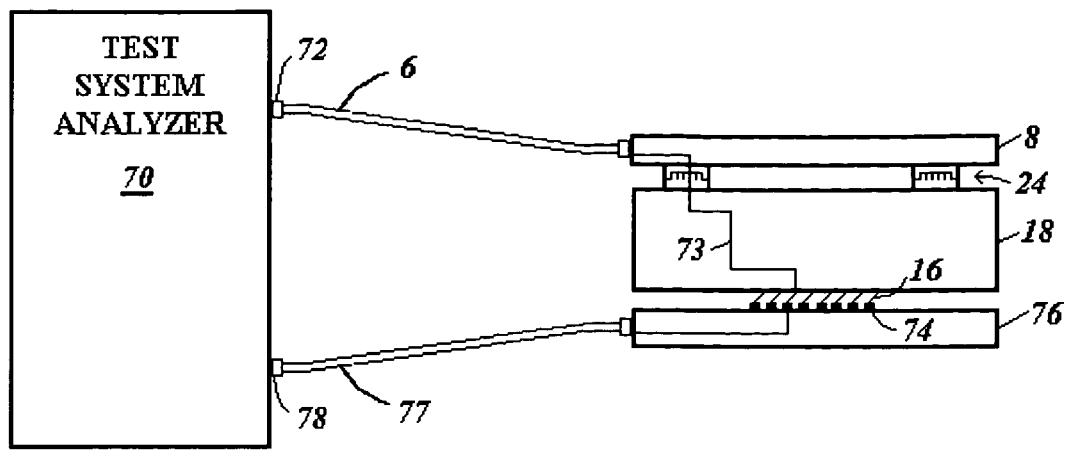
FIG. 3 illustrates a typical test setup to determine the bandwidth of a channel of a test system.
Figure 4:
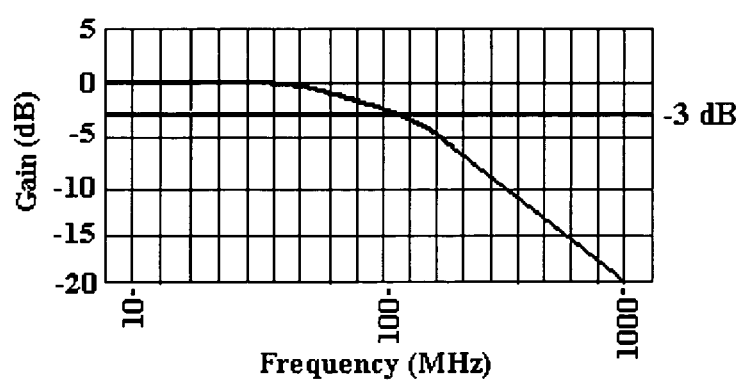
FIG. 4 shows a plot of gain vs. frequency illustrating bandwidth definition as the 3 dB roll off point.
Figure 5:
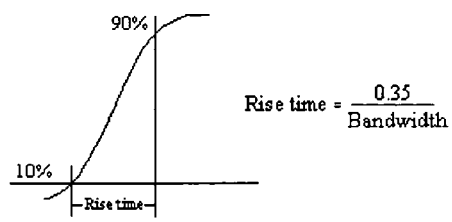
FIG. 5 illustrates determination of bandwidth using a 10% to 90% rise time measurement.
Figure 6:
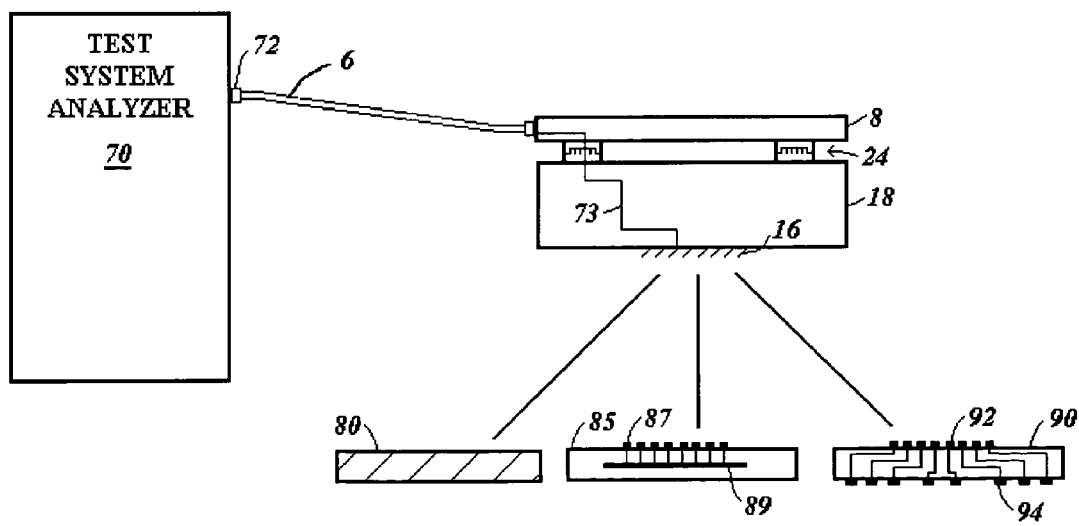
FIG. 6 illustrates a test setup to used determine the bandwidth of a channel of a test system according to the present invention.

FIG. 6 illustrates test configurations to enable determination of bandwidth of a channel of a test system according to the present invention. Similar to FIG. 3, the test components include a test system analyzer 70, which may be the tester system 4 of FIG. 1 itself, or a separate calibration device such as a vector network analyzer (VNA) used to determine the S parameters.

With only a one-port measurement needed for the TDR measurement, a single test port 72 from the analyzer 70 is shown. The single port 72 of the test system analyzer 70 is connected to a test channel 73 in the cable 6 which is provided through test head 8, probe card 18 and one of its probes 16. Unlike the configuration of FIG. 3, however, a PCB providing a connection from the probes 16 to a second test port is not required. Instead a reflection back to the first port 72 through the probes 16 is created by connecting a short or open circuit.

A short circuit in one embodiment is created by connecting the probes 16 to a metal substrate as illustrated by substrate 80. To provide a short circuit with minimal phase shift or loss, the metal substrate 80 can be plated with a highly conductive material such as gold. Alternatively, the short circuit can be created by connecting the probes 16 to pads 87 on a substrate 85. The pads 87 are then internally linked by vias to a conductive ground layer 89. Alternatively, a substrate 90 can be used with pads 92 for connecting probes 16 through traces to discrete elements 94, or connectors for connecting to such elements. To minimize phase shift and loss, it is desirable to place the ground plane as close to the probes 16 as possible. Any phase shift, or loss created by the ground plane can, however, be calibrated out of the TDR measurement as described to follow.

An open circuit can be created by leaving the probes 16 unconnected, removing the need for a test fixture to determine bandwidth. With no test fixture required and the test controller 4 functioning as the test system analyzer 70, bandwidth of a channel can be re-determined during wafer testing to assure wear of the probes or other factors do not change the bandwidth. Should changes occur during testing, a rise time measurement can be determined to factor out measurement errors. In an alternative open circuit test configuration, a fixture such as substrate 85 or substrate 90 can be used with pads to connect the probes 16 to either an internal or external element to create a 90 degree phase shift with minimal loss similar to an open circuit.

With a channel terminated in a short or open circuit as described above, bandwidth can be estimated using the following procedure according to the present invention. First, a TDR measurement is made of a channel terminated in a short circuit or open circuit. Next the maximum slope of the reflection from the TDR measurement is determined, the slope being a ratio of the change in applied voltage to change in time.

Next a calculation of interpolated overall $1^{st}$ order rise or fall time is made. In one embodiment, the calculation is made by measuring the maximum slope of the reflected voltage, the results having units of volts/time. Knowing the amplitude of the applied voltage, one can calculate the interpolated rise or fall time from 0% to 100% for the overall system (Toa0-100) by dividing the applied voltage by the measured maximum slope. Multiplying Toa0-100 by 80% yields the interpolated overall 10% to 90% rise time (Toa10-90) since 80% of the time period is included from the 10% voltage point time to the 90% voltage point time. Alternatively, if a 20% to 80% rise time calculation is desired, 60% of the Toa0-100 period would be used since 60% of the time period occurs between the 20% voltage point and the 80% voltage point. It is further understood that rise or fall time can likewise be measured between other percentage points if desired.

In a further step, the TDR measurement and $1^{st}$ order rise time interpolation are repeated without the channel connected. This reveals the rise time of the test equipment, Ttest, alone. The rise time contribution of measuring equipment components (Ttest) including the cable 6, test head 8, or other connectors used to determine rise time are then removed using the equation indicating that the overall rise time of a system (Toa) is the square root of the sum of the squares of the individual rise times, including the system rise time Ttest and the round trip rise time of the channel (Tround):

$$Toa=\sqrt{Ttest^2+Tround^2}$$

Note that if the test system analyzer 70, cable 6 and test head 8 are the components used during later wafer IC testing, their rise time contributions will typically be included to determine channel bandwidth. However, if separate components are used for bandwidth determination that are not later included in the channel during wafer IC testing, the contribution of the separate components will preferably be removed using the equation for Toa.

Since the reflection passes through the channel twice, Tround is expressed in light of the Tforward and Treverse rise times through the channel as follows:

$$Tround=\sqrt{Tforward^2+Treverse^2}$$

To determine the channel rise time Tchannel, Tround is, thus, next divided by the square root of two to determine the channel rise time Tchannel as follows:

$$Tchannel=Tforward=Treverse=Tround/\sqrt{2}$$

This yields the approximate rise time through the channel once.

The TDR measurement provides one example of a measurement technique used with the present invention. As another example measurements can be taken using a Time Domain Transmission (TDT) measurement. With a TDT measurement, rise time is determined from a measurement at the end of the channel 16 from a signal that passes through the channel only once, rather than twice as with TDR. Thus, using a TDT measurement, Tchannel=Tforward without requiring Tround to be divided by the square root of two, since the channel TDT measurement is one way, and the round trip Tround measurement is not made with the Treflection component as in the TDR method.

Channel bandwidth is next calculated using an appropriate equation based on the channel rise time measurement, Tchannel. For example with a 10% to 90% approximate rise time measurement, the formula: bandwidth=0.35/rise time will be used. Similarly for a 20% to 80% approximate rise time measurement, the formula: bandwidth=0.22/rise time will be used. It is noted that the 10% to 90% rise time formula: bandwidth=0.35/rise time is determined based on the $1^{st}$ order operations done to the rise time. The accuracy of the Bandwidth result will vary depending on the amount of $2^{nd}$ and higher order components of the TDR measurement that is eliminated from the procedure.

Once bandwidth information is obtained for one or more channels of a test system as described above, it can be stored in local memory located on a component of the test system, such as on the probe card or load board. The bandwidth information can be associated with other information, such as date and method of test, and stored in the local memory for later retrieval.

Although the present invention has been described above with particularity, this was merely to teach one of ordinary skill in the art how to make and use the invention. Many additional modifications will fall within the scope of the invention, as that scope is defined by the following claims.

What is claimed is:

1. A method to determine bandwidth of a test system channel containing a spring probe, the method comprising:

making a single port Time Domain Reflectometer (TDR) measurement of rise time of the channel, wherein the making a single port Time Domain Reflectometer (TDR) measurement comprises: applying a signal to a first end of the channel; determining a maximum slope at the first end of the channel of a reflection of the signal from a second end of the channel; and using the maximum slope to determine the rise time of the channel; and using the rise time to determine the bandwidth.

2. The method of claim 1, further comprising terminating the channel in a short circuit during the TDR measurement.

3. The method of claim 2, wherein the short circuit is created by connecting the spring probe to a metal ground plane.

4. The method of claim 2, wherein the short circuit is at the probe.

5. The method of claim 1, further comprising terminating the channel in an open circuit during the TDR measurement.

6. The method of claim 5, wherein the open circuit is at the probe.

7. The method of claim 5, wherein the open circuit is obtained by not contacting one end of the spring probe.

8. The method of claim 1, wherein the spring probe comprises the second end of the channel.

9. The method of claim 8, wherein:
the spring probe is configured to contact and thereby form an electrical connection with an electronic device to be tested;
the channel is configured to provide a communications path between a tester configured to provide test signals for testing the electronic device and the spring probe; and
the first end of the channel corresponds to a connection of the channel to the tester.

10. The method of claim 1, wherein the using the maximum slope to determine the rise time comprises dividing a voltage of the signal applied to the first end of the channel by the maximum slope.

11. The method of claim 10, wherein the maximum slope is in units of voltage per time.

12. The method of claim 1, wherein the making a single port Time Domain Reflectometer (TDR) measurement of rise time of the channel comprises:
determining a rise time of equipment used to determine the maximum slope, and
utilizing the rise time of the equipment in determining the rise time of the channel.

13. The method of claim 1, wherein:
the rise time of the channel is determined by dividing an applied voltage from the TDR measurement by the maximum slope to obtain the rise time; and
the bandwidth is determined by calculating the bandwidth based on a formula relating the rise time to the bandwidth.

14. The method of claim 13, wherein the applied voltage is determined over 80% of the transition from a 10% applied voltage of the transition to a 90% applied voltage of the transition; and wherein the formula relating rise time to bandwidth is bandwidth=0.35/rise time.

15. The method of claim 13, wherein the applied voltage is determined over 60% of the transition from a 20% applied voltage value of the transition to a 80% applied voltage value; and wherein the formula relating rise time to bandwidth is: bandwidth=0.22/rise time.

16. The method of claim 1, wherein:
the rise time of the channel is determined by:
dividing an applied voltage from the TDR measurement by the maximum slope to obtain an overall rise time measurement;
removing a rise time contribution of test equipment connected to the channel from the overall rise time measurement to obtain a round trip channel rise time measurement;
dividing the round trip rise time measurement by the square root of two to obtain a channel rise time measurement; and
the bandwidth is determined by calculating the bandwidth based on a formula relating the channel rise time measurement to the bandwidth.

17. The method of claim 16, wherein the rise time contribution of the test equipment is removed using a formula indicating the overall rise time of a system is equal to a square root of a sum of squares of the individual component rise times.

* * * * *